United States Patent [19]

Tinti

[11] 4,018,625

[45] Apr. 19, 1977

[54] THERMO-ELECTRIC ASSEMBLIES

[76] Inventor: Pietro Tinti, Via Unione Sovietica 9, Florence, Italy, I-50126

[22] Filed: Mar. 25, 1975

[21] Appl. No.: 561,846

[52] U.S. Cl. .............................. 136/225; 136/202; 136/208; 136/227; 29/573; 29/578; 29/579

[51] Int. Cl.² ..................................... H01L 21/02

[58] Field of Search .................. 29/573, 578, 579; 136/202, 208, 225, 227

[56] References Cited

UNITED STATES PATENTS

| | | | |
|---|---|---|---|
| 3,099,575 | 7/1963 | Hill | 136/225 |
| 3,183,121 | 5/1965 | Moeller | 29/573 |
| 3,434,203 | 3/1969 | Thorp | 29/573 |
| 3,522,106 | 7/1970 | Debiesse et al. | 29/573 |
| 3,528,893 | 9/1970 | Christie et al. | 29/573 |
| 3,607,445 | 9/1971 | Hines | 136/225 |
| 3,740,273 | 6/1973 | Adler et al. | 136/202 |
| 3,879,229 | 4/1975 | Gilbert | 136/225 |

Primary Examiner—Brooks H. Hunt
Attorney, Agent, or Firm—Hopgood, Calimafde, Kalil, Blaustein & Lieberman

[57] ABSTRACT

A thermo-electric assembly comprises a plurality of metal layers, of alternately different metals, with dielectric layers between them, the layers being produced by deposition from the vapor-phase in a vacuum. Each dielectric layer separates adjacent metal layers only over part of the facing metal layer surfaces, so that the metal layers contact over the remaining part of their facing surfaces to form a thermo-couple junction. The even-numbered junctions through the stack are physically displaced from the odd-numbered junctions to enable a temperature difference to be applied between the two sets of junctions.

2 Claims, 11 Drawing Figures

THERMO-ELECTRIC ASSEMBLIES

BACKGROUND TO THE INVENTION

The invention relates to thermo-electric assemblies and methods of making them.

Thermo-electric assemblies in the form of thermo-electric batteries are known in which a series of metal elements of alternately different metals are joined end to end to form a series of thermo-coupled junctions. If a temperature difference is created between, on the one hand, the odd-numbered junctions (counted from one end of the series) and the even-numbered junctions on the other hand, a thermo-electric e.m.f. appears between terminals respectively connected to the metal elements at the ends of the series.

An object of the invention is to provide an improved thermo-electric assembly.

Another object of the invention is to provide an improved thermo-electric assembly having a greater power output.

A further object of the invention is to provide an improved method of making a thermo-electric assembly.

BRIEF SUMMARY OF THE INVENTION

According to the invention, there is provided a thermo-electric assembly, comprising a plurality of metal layers overlaying each other with the metal of one layer being different than the metal of the layers between which it is situated, each metal layer being in contact over part only of its surface with the next adjacent metal layer to form a metal-metal junction, alternate ones of the said junctions being spaced laterally with respect to the directions of extension of the layers from the intervening ones of said junctions, whereby a temperature difference may be applied between the laterally spaced junctions to generate a thermo-electric e.m.f. between the outermost metal layers, and dielectric layers between and separating the remaining parts of the surfaces of the metal layers.

According to the invention, there is also provided a thermo-electric assembly, comprising metal layers of alternately different metals deposited from the vapor phase in vacuum, and a dielectric layer between adjacent said metal layers to separate the metal layers across part only of their facing surfaces so that they are in contact over the remaining part of their surfaces to provide a metal-metal thermo-couple junction.

According to the invention, there is further provided a method of producing a thermo-electric assembly, including the steps of alternating depositing metal and dielectric layers on to each other with the metal layers being of alternately different metals, each dielectric layer being deposited to separate two adjacent ones of the metal layers across part only of their facing surfaces so that they are in metal-metal contact over the remaining parts of their facing surfaces to form a metal-metal thermo-couple junction, at least the metal layers being deposited from the vapor phase in a vacuum.

DESCRIPTION OF THE DRAWINGS

A thermo-electric assembly embodying the invention, and a method employing the invention of making a thermo-electric assembly, will now be described, by way of example only, with reference to the accompanying diagrammatic drawings in which:

As shown in FIG. 1, the thermo-electric assemblies to be described comprise an arrangement of metal elements A and B arranged alternately in a series or stack, the elements being connected to each other, to form junctions 1, 2, 3, 4, 5, 6 and 7. As shown, the odd-numbered junctions lie on a different side of a median line than the even-numbered junctions. If a temperature difference is applied between the odd-numbered junctions on the one hand and the even-numbered junctions on the other hand, an electrical potential difference appears between the ends X and Y of the series of elements and a current will flow through an external circuit connected between X and Y.

FIGS. 2 to 6 illustrate stages in a method for forming layers of different metals corresponding to the elements A and B, the elements being joined to each other where appropriate and being separated from each other where appropriate by mutual insulation zones. The layers are produced by vaporisation under vacuum and subsequent condensation.

As shown in FIG. 2, a first layer 11A of a metal, such as antimony, is deposited onto the adhesion surface 13 of a suitable support. Such deposition is carried out by evaporation under vacuum and deposition from the vapor phase. By means of a similar technique, an insulating layer 15 of a dielectric material is deposited onto part of the exposed surface of the layer 11A, the area of deposition being controlled by means of a suitable screen for example.

Figure 4:
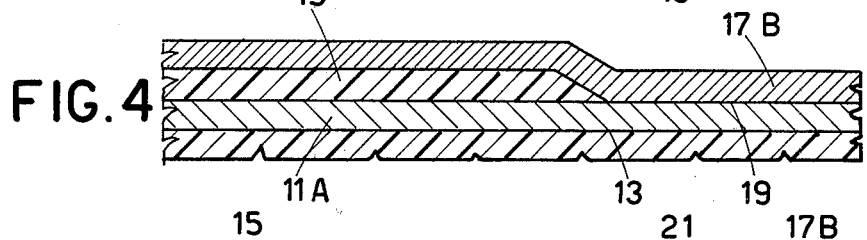

A layer 17B of a different metal, for example bismuth, is then deposited (again by evaporation under vacuum) onto the whole of the exposed surfaces of the layers 11A and 15 as shown in FIG. 4. The metal layer 17B is therefore in contact with the layer 11A along the partial surface 19 to form a metal-metal junction but is insulated from the layer 11A by the dielectric layer 15.

Figure 5:
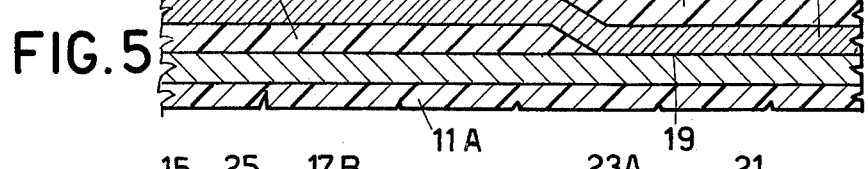

A dielectric layer 21 is then deposited (again by evaporation under vacuum) onto part of the exposed surface of the metal layer 17B (see FIG. 5), the layer 21 being offset with respect to the layer 15 and overlying the metal surface 19.

Figure 6:
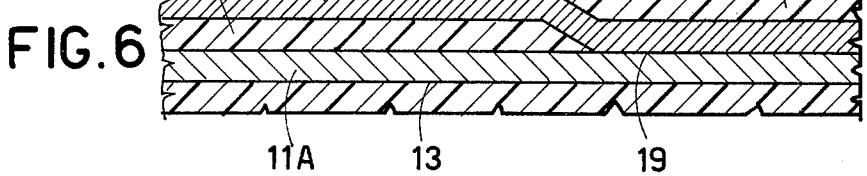

A complete metal layer 23A (of the same metal as the layer 11A) is then deposited by evaporation under vacuum, this layer being adherent partly to the exposed surface of the dielectric layer 21 and partly to the exposed surface 25 of the metal layer 17B, see FIG. 6.

Figure 1:
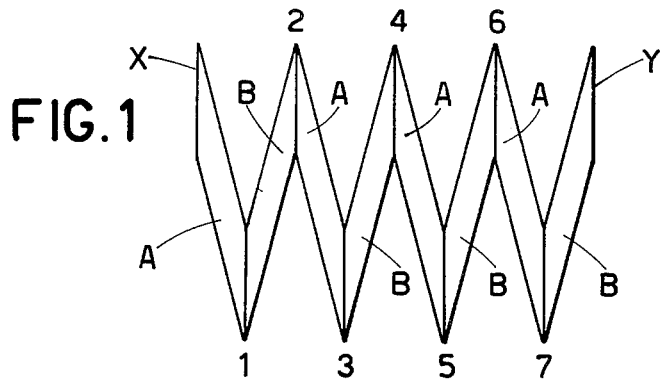
FIG. 1 is a schematic diagram showing the functional arrangement of metal elements in the assembly.
Figure 2:
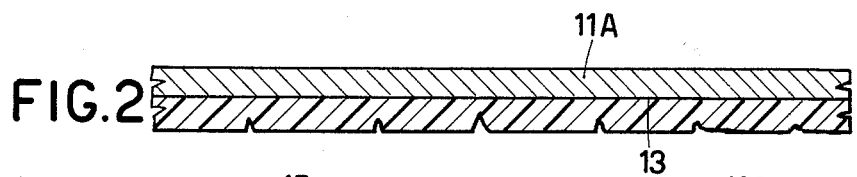
FIGS. 2 to 6 illustrate stages in the method, with the relative thicknesses of different layers in the assembly being altered for case of explanation.
Figure 3:
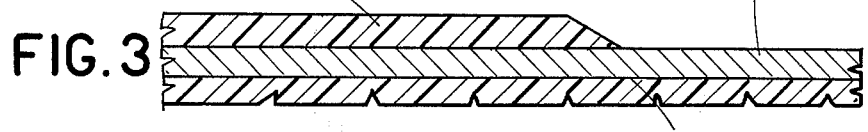

This process can then be continued so as to form a multiplicity of metal layers, each metal layer being separated over part only of its area from the adjacent metal layer by means of dielectric layers, the areas where the metal layers contact each other corresponding to the odd and even numbered junctions of FIG. 1.

The method described enables a relatively large number of metal layers, interspersed with dielectric layers, to be arranged within a small overall thickness. The method of producing the layers provides good contact between adjacent metal layers, enabling relatively high current intensity and electrical power to be derived from the assembly, the generated electrical potential difference being relatively high in relation to the overall size.

The thermo-electric effect is dependent on the temperature difference between the odd-numbered junctions (such as the junction at the surface 19 — FIG. 5) on the one hand and the even-numbered junctions (such as the junction at the surface 25 — FIG. 6) on the other hand. When such a temperature difference is produced, a thermo-electric e.m.f. appears between terminals connected respectively to the two outermost metal layers. As the surface 19 (and surfaces corresponding thereto) is physically offset with respect to the surface 25 (and surfaces corresponding thereto), the required temperature difference can be obtained, and it will be appreciated that the lateral spacing between the surfaces 19 and 25 can be increased beyond that shown in FIGS. 2 to 6.

The intensity of the current flow which can be obtained is dependent on the area of the junctions.

Figure 7:
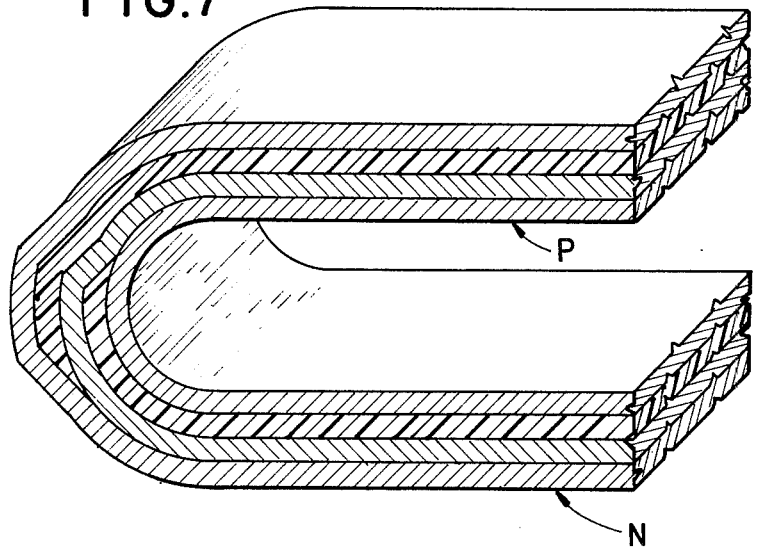
FIGS. 7 and 8 show, in perspective, sectional views of two modified forms of the assembly.

Provided a suitable support material is used, the whole arrangement may be flexible and/or arranged to provide any desired contour. For example, as shown in FIG. 7 (where, for drawing clarity, the numbers of layers illustrated is reduced, a thermo-electric battery unit, produced by deposition of layers as described with reference to FIG. 6, is shown in the form of a horseshoe. The horseshoe has a leg N including (for example) all the even-numbered junctions and a leg P including all the remaining junctions. With such an arrangement, a temperature difference between the legs N and P is easily obtained. Again, the output terminals are connected to the two outermost layers.

Figure 8:
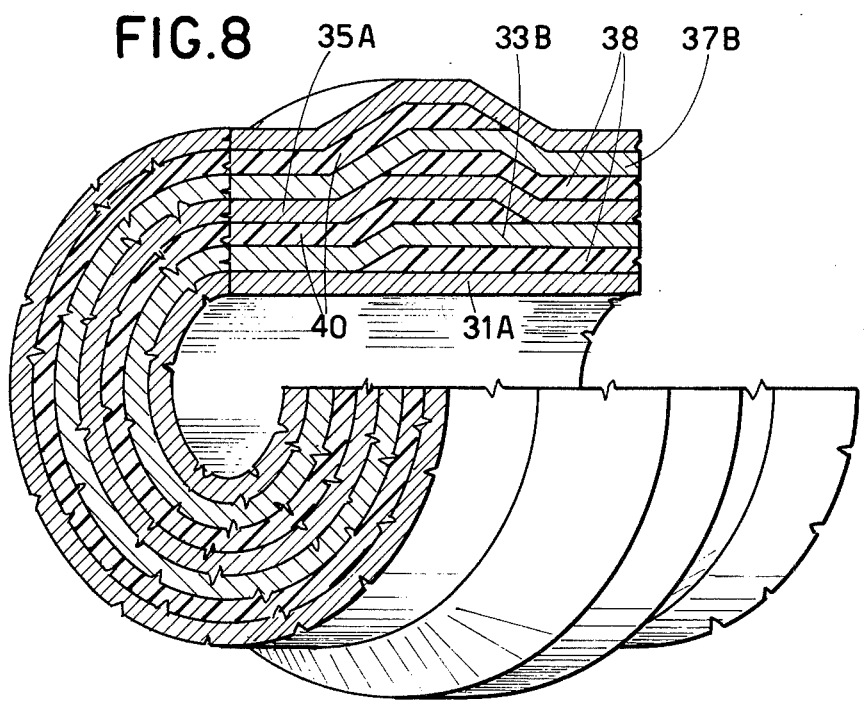

FIG. 8 shows a modification in which the layers are arranged in cylindrical form. Metal layers 31A, 33B, 35A, 37B extend for the entire length of the tubular structure, whereas the dielectric layers 38 and 40 extend only partially along the axial length, layers 38 extending partway along the tubular structure from one of its ends and the layers 40 extending partway therealong from its opposite end. With such an arrangement the required temperature difference is applied between the two ends of the tubular structure. The output terminals corresponding to the terminals X and Y of FIG. 1 are connected to the inner and outermost metal layers.

It will be appreciated that the structure shown in FIG. 7 is produced by bending the sandwich produced as shown in FIGS. 2 to 6 about an axis extending along the zone separating the junctions, while the structure shown in FIG. 8 is produced by bending the sandwich about a perpendicular axis.

Figure 9:
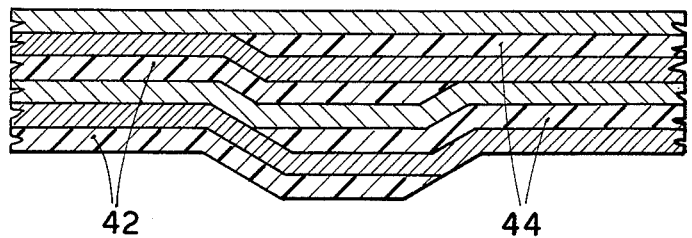
FIG. 9 is a cross-section through part of an assembly as produced by the method of FIGS. 2 to 6, to illustrate a spacing zone.

FIG. 9 shows an assembly produced generally as shown in FIGS. 2 to 6 but with further metal and dielectric layers applied thereto (in a similar manner to that already described). FIG. 9 shows how the dielectric layers 42 and 44 all extend into a central zone which separates zones in which lie the metal-metal junctions corresponding to the even and odd-numbered junctions of FIG. 1.

Any suitable apparatus may be used for producing the assemblies described above, using the technique of evaporation under vacuum and subsequent deposition. Where the layers have a relatively large width, it may be advantageous for the apparatus to incorporate means for providing vaporised metal and vaporised dielectric material at the appropriate times, and means for enabling relative movement between such vapor generating means on the one hand and a supporting structure on the other hand, so that each layer is laid down as the relative movement takes place.

Figure 10:
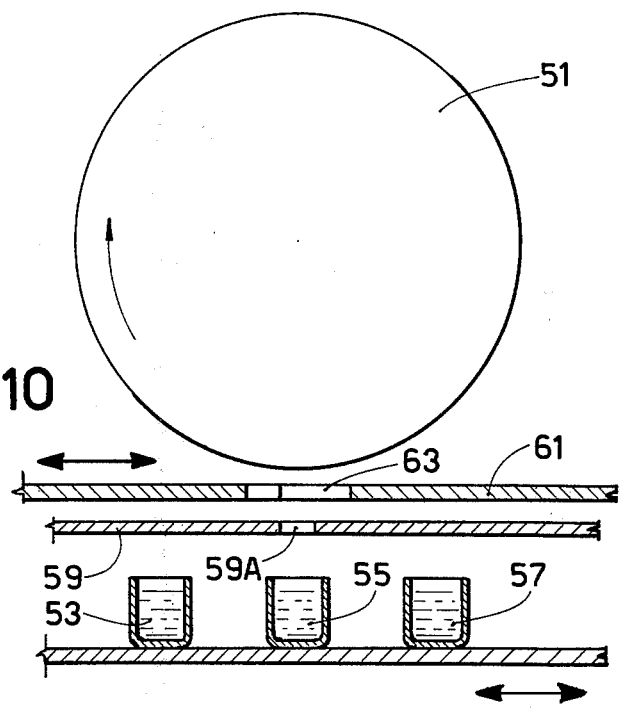
FIG. 10 is a schematic diagram of equipment for producing the modified assembly of FIG. 8.
Figure 11:
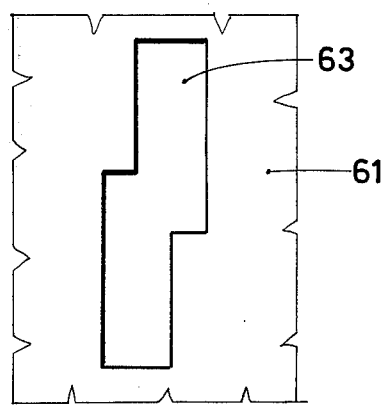
FIG. 11 is a plan view of a slit screen used in the equipment of FIG. 10.

Apparatus for producing a structure as shown in FIG. 8 is illustrated in FIGS. 10 and 11.

As shown in FIG. 10, the apparatus incorporates a rotary cylindrical support 51. Three heated crucibles 53, 55 and 57 are provided in which are respectively evaporated, under vacuum, one of the two metals (e.g. antimony), the dielectric material, and the other of the two metals (e.g. bismuth). A screening surface 59 is provided having a slit 59A through which the vapors of any one of the three crucibles (according to the position of the crucibles relative to the slit 59A) may pass and reach the surface of the rotary support 51 overlying the slit. A movable screen 61 is arranged adjacent the surface 59 and has a window 63 shaped as shown in plan in FIG. 11. By shifting the screen 61 to and fro and in the direction of the arrows shown, the vapor (metal or dielectric vapor depending on which of the three crucibles is positioned under the slit 59A) is appropriately deposited on the surface of the rotary support 51. When the latter has completed a single revolution, the support on which the crucibles 53, 55 and 57 are mounted is moved in one or other of the directions indicated by the arrows and the next layer is deposited in similar fashion. It will be appreciated that the form of movement which is undergone during this process by the screen 61 determines whether the deposition extends for the full axial length of the rotary support (as is required for each deposited metal layer), or extends partway along the axial length of the support 51 and from one or other of the two axial ends of the support (as is required for the dielectric layers).

The apparatus of FIGS. 10 and 11 may be modified to deposit layers on to other surfaces of revolution besides cylinders.

Various modifications can be made to the invention without departing from the spirit and scope of the invention as defined by the appendant claims.

What is claimed is:

1. A method of producing a thermo-electric assembly comprising the steps of depositing a first type of metal by vapor-phase deposition onto a rotating surface in a vacuum to form a cylindrical first metal layer, depositing a first dielectric layer by vapor phase deposition in a vacuum onto a part of the surface of said first metal layer, said first dielectric layer extending axially from one end of said first metal layer, thereby to leave exposed a portion of said surface of said first metal surface at the opposite end thereof, depositing a second cylindrical metal layer, of a different type than said first metal layer, by vapor-phase deposition in a vacuum, onto the surface of said first dielectric layer and said exposed portion of said surface of said first metal layer, so as to form with said exposed portion of said first metal layer a first metal-metal junction where said second metal layer contacts said exposed portion of said first metal layer, depositing a second dielectric layer by vapor-phase deposition in a vacuum onto a part of the surface of said second metal layer, said second dielectric layer extending axially from one end of said second metal layer over a portion of said second metal layer leaving the remaining portion of said second metal layer exposed, and depositing a cylindrical third metal layer by vapor-phase deposition in a vacuum onto said second dielectric layer and the exposed surface of said second metal layer to form a metal-metal junction where said third metal layer contacts the exposed portion of said second metal layer, the metal of the third metal layer being of the same type as the metal of the first metal layer, said first and second metal-metal junctions being formed at alternating opposite axial ends of said cylindrical metal layers, whereby a temperature difference can be created between said junctions to generate a thermo-electric e.m.f. between said first and third metal layers.

2. A cylindrical thermo-electric assembly, comprising:

a plurality of cylindrical metal layers each extending along the axial length of said assembly and overlying each other with the metal of one of said metal layers being different than the metal of the one of said metal layers between which it is situated, and a plurality of dielectric layers arranged between and separating the remaining parts of the surfaces of said metal layers, said metal and dielectric layers being cylindrical in configuration, each successive dielectric layer extending axially from alternating ends of said assembly along a respective but alternately different one of said metal layers so as to terminate short of the opposite ends of said metal layers, thereby to leave exposed a portion of the underlying one of said metal layers, whereby said metal-metal junctions are formed between the exposed portion of one of said metal layers and that portion of the overlying one of said metal layers covered by an overlying one of said dielectric layers, said metal-metal junctions thus being formed at alternate axial ends of said cylindrical assembly, whereby a temperature difference may be applied between said axially spaced junctions to generate a thermo-electric e.m.f. between the outermost ones of said metal layers.

* * * * *